(12) United States Patent
Carney

(10) Patent No.: US 6,418,387 B1
(45) Date of Patent: Jul. 9, 2002

(54) METHOD OF AND SYSTEM FOR GENERATING A BINARY SHMOO PLOT IN N-DIMENSIONAL SPACE

(75) Inventor: Michael D. Carney, Medway, MA (US)

(73) Assignee: LTX Corporation, Westwood, MA (US)

(*) Notice: Subject to any disclaimer, the term of this patent is extended or adjusted under 35 U.S.C. 154(b) by 0 days.

(21) Appl. No.: 09/344,861

(22) Filed: Jun. 28, 1999

(51) Int. Cl.$^7$ ................................................ G01R 31/28
(52) U.S. Cl. ........................... 702/81; 702/57; 702/81; 702/118; 714/724
(58) Field of Search ............................. 702/57, 66, 67, 702/68, 81, 82, 83, 84, 108, 117, 118, 119, 121, 122, 123, 127, 179, 180, 182, 183, 184, 185, 187, FOR 103, 104, 110, 135, 134, 137, 139, 141, 155, 170, 171; 700/121; 345/400; 714/727, 724, 799, 723, 721, 745

(56) References Cited

U.S. PATENT DOCUMENTS

| | | | |
|---|---|---|---|
| 3,633,174 A | * 1/1972 | Griffin | 340/172.5 |
| 3,655,959 A | * 4/1972 | Chernow et al. | 235/153 |
| 4,502,140 A | * 2/1985 | Proebsting | 371/28 |
| 5,006,807 A | * 4/1991 | Blum | 324/537 |
| 5,107,205 A | * 4/1992 | Ebihara | 324/158 R |
| 5,200,696 A | * 4/1993 | Menis et al. | 324/158 R |
| 5,339,269 A | * 8/1994 | Takagi | 365/63 |
| 5,412,349 A | * 5/1995 | Young et al. | 331/34 |
| 5,481,550 A | * 1/1996 | Garcia et al. | 371/27 |
| 5,631,910 A | * 5/1997 | Nozuyama et al. | 371/22.1 |
| 5,841,271 A | * 11/1998 | Nakayama | 323/316 |
| 5,889,429 A | * 3/1999 | Kobayashi et al. | 327/540 |
| 5,952,863 A | * 9/1999 | Jones et al. | 327/295 |
| 6,079,038 A | * 6/2000 | Huston et al. | 714/724 |

FOREIGN PATENT DOCUMENTS

| | | | |
|---|---|---|---|
| JP | 04236372 | * | 8/1992 |
| JP | 07218299 | * | 8/1995 |
| JP | 11190761 | * | 7/1999 |

* cited by examiner

Primary Examiner—Patrick Assouad
Assistant Examiner—Carol S. W. Tsai
(74) Attorney, Agent, or Firm—McDermott, Will & Emery

(57) ABSTRACT

A method of generating a plot that evinces common result regions of a test as a function of controllable input parameters includes defining an overall plot region that is a function of the maximum and a minimum of each input parameter. The method further subdivides the overall plot region into at least two sub-regions, where each of the sub-regions has a sub-region boundary. The method evaluates, for each of the sub-regions, a plurality of boundary test conditions on the sub-region boundary according to the test, so as to assign a test status to each of the plurality of boundary test conditions. For each of the sub-regions with at least a predetermined threshold number of boundary test conditions having a common test status, the method designates the sub-region with the common test status. For each of the sub-regions not having at least the predetermined threshold number of boundary test conditions with a common test status, the method designates that sub-region with an indeterminate status. The method recursively performs the subdividing step, the evaluating step and the designating step for each of the sub-regions designated with an unknown result status until all of said sub-regions are designated by a determinate test status.

26 Claims, 12 Drawing Sheets

METHOD OF AND SYSTEM FOR GENERATING A BINARY SHMOO PLOT IN N-DIMENSIONAL SPACE

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

FIELD OF THE INVENTION

The present invention relates to methods of and systems for plotting data, and more particularly, to methods of and systems for efficiently plotting data in the form of N dimensional shmoo plots.

BACKGROUND OF THE INVENTION

It is often necessary to characterize the performance of an electrical device with respect to functional parameters associated with the device. This characterization is sometimes referred to as parametric testing. One way to measure the performance of such a device is on a pass/fail basis. A complete parametric test could provide a pass/fail result for every possible combination of all values of the functional parameters in question. This type of test provides users of the device information as to how the device will perform over a broad range of conditions.

For example, a computer memory board designer could utilize data regarding how a dynamic random access memory (hereinafter referred to as DRAM) device performs with respect to various functional parameters, e.g., the supply voltage ($V_{CC}$) into the device, and the device read/write cycle time (i.e., the amount of time it takes to write to and subsequently read from the DRAM). One way to characterize the performance of such a device is to apply a simple read/write test as follows: if a series of test patterns can be written and subsequently read from the device, then the device is deemed to have passed the performance test; otherwise, the device is deemed to have failed the performance test. Assume that the nominal supply voltage of the device is 3.0V and the nominal read/write cycle time is 10 nS. A parametric test may be arranged to evaluate the device performance as $V_{CC}$ varies from 2.2V to 3.7V in steps of 0.1V (a total of 16 discrete voltages), and as the read/write cycle time varies from 4.5 to 12 nS in steps of 0.5 nS (for a total of 16 discrete cycle times). Thus, the total number of individual performance tests that must be conducted to evaluate all possible combinations of $V_{CC}$ and read/write cycle time is 16×16=256. Each individual combination of test parameters is referred to herein as a test condition. FIG. 1 shows these 256 pass/fail results in what is known in the art as a 'shmoo' (or alternatively, schmoo, smoo, shmu, schmu, etc.) plot. FIG. 1 is an example of a two dimensional shmoo plot, although in general, a shmoo plot may be N-dimensional, N being an integer greater than 1. Although the term 'plot' suggests a graphical depiction of the data (i.e., at most three dimensions), description the term 'plot' should be taken as a general representation of data in N-dimensional data space, memory space, etc. In the shmoo plot of FIG. 1, an array of 16 rows and 16 columns represents the 256 individual performance tests; each row represents one of the 16 cycle times, and each column represents one of the 16 $V_{CC}$ voltages. Thus, the array element in the $i^{th}$ row and $j^{th}$ column corresponds to the performance test $T_{ij}$ in which the $i^{th}$ cycle time and the $j^{th}$ $V_{CC}$ voltage are applied to the device. A darkened array element represents a failed test $T_{ij}$, and a white array element represents a passed test $T_{ij}$.

As FIG. 1 illustrates, a shmoo plot provides a clear, graphical indication of the performance envelope of a device. An observer can easily comprehend where the device performance transitions from passing to failing as the input parameters vary. However, a significant amount of time is required to perform the tests that form all of the individual array elements of the shmoo plot. In the simple FIG. 1 example, assuming that each individual test takes 100 $\mu$S to perform, the entire shmoo plot will take 16×16×100 $\mu$S=25.6 mS to complete. In a more realistic parametric test, each variable in the array might be swept over a range of 100 values, and each individual test could take on the order of a second to complete. A shmoo plot corresponding to such a parametric test would take 100×100×1 S=2.78 hours to complete. If the parametric dimensional space increases from two to three (e.g., assume the device is to be further tested over a temperature range of 100 temperature values), the shmoo plot corresponding to such a parametric test would take 100×100×100×1 S=11.6 days to complete. Thus, the amount of time to complete the shmoo plot increases directly with the amount of time per test, and exponentially with the order of the dimensional space.

It is an object of the present invention to substantially overcome the above-identified disadvantages and drawbacks of the prior art.

SUMMARY OF THE INVENTION

The foregoing and other objects are achieved by the invention which in one aspect comprises a method of generating a plot that evinces common result regions of a test as a function of at least one controllable input parameter, where each parameter has a predetermined range and a predetermined resolution. The method defines an overall plot region that is a function of a maximum and a minimum of each predetermined range. The method further subdivides the overall plot region into at least two sub-regions, each of the sub-regions having a sub-region boundary. The method evaluates, for each of the sub-regions, a plurality of boundary test conditions on the sub-region boundary according to the test, so as to assign a test status to each of the plurality of boundary test conditions. For each of the sub-regions with at least a predetermined threshold number of boundary test conditions having a common test status, the method designates that sub-region with the common test status. For each of the sub-regions not having at least the predetermined threshold number of boundary test conditions with a common test status, the method designates that sub-region with an indeterminate status.

In another embodiment of the invention, the method further including the step of recursively performing the subdividing step, the evaluating step and the designating step for each of the sub-regions designated with an unknown, indeterminate result status until all of the sub-regions are designated by a determinate test status.

In another embodiment of the invention, the evaluating step further includes the step of assigning either a pass test status or a fail test status to each of the plurality of boundary test conditions.

In another embodiment of the invention, the sub-region boundary includes a plurality of corner test conditions, and the plurality of boundary test conditions includes the corner test conditions.

In another embodiment of the invention, the predetermined threshold number of boundary test conditions includes all of the corner test conditions.

In another embodiment of the invention, the at least two sub-regions are substantially identical.

In another embodiment of the invention, the plot is an N-dimensional plot that corresponds to N controllable input parameters.

In another embodiment of the invention, the method further includes the step of searching for at least one discrepancy between (i) a test status of a test condition designated by the designating step, and (ii) a test status of the test condition according to the performance test.

In another embodiment of the invention, the method further includes the step of evaluating, via the performance test, those test conditions that have a test status designated by the designating step and are adjacent to a test condition having a test status assigned according to the performance test.

In another embodiment of the invention, the method further includes the step of reassigning the test condition according to the performance test.

In another aspect, the invention comprises a method of generating a shmoo plot as a function of a performance test and a plurality of parameters, each of the parameters having a predetermined parameter range and a predetermined parameter resolution. The method defines an overall shmoo plot region as a function of a maximum and a minimum of each predetermined parameter range. The method further subdivides the overall shmoo plot region into sub-regions, and evaluates each of a plurality of corner test conditions of each of the sub-regions according to the performance test, so as to assign a test status, including either a pass status or a fail status, to each of the corner test conditions depending upon a result of the performance test. For each of the sub-regions having all of the corner test conditions assigned a common status, the method further designates those sub-regions with the common status. For each of the sub-regions not having all of the corner test conditions assigned a status, the method repeats the subdividing, evaluating and designating steps until all of those sub-regions have been designated with the test status.

In another aspect, the invention comprises a method of generating an N dimensional shmoo plot as a function of a performance test and N parameters, each of the parameters having a predetermined parameter range and a predetermined parameter resolution. The method defines an overall shmoo plot region as a function of a maximum and a minimum of each predetermined parameter range. The method subdivides the overall shmoo plot region into $2^N$ equal sub-regions, each the sub-region having $2^N$ corner test conditions, and evaluates each of the $2^N$ corner test conditions of each of the $2^N$ sub-regions according to the performance test, so as to assign a test status, including either a pass status or a fail status, to each of the $2^{2N}$ corner test conditions depending upon a result of the performance test. For each of the $2^N$ sub-regions having all of the $2^N$ corner test conditions assigned a common status, the method designates the sub-region with the common status. For each of the $2^N$ subregions not having all of the $2^N$ corner test conditions assigned a status, the method repeats the subdividing, evaluating and designating steps until all of the sub-regions have been designated with the test status.

In another aspect, the invention comprises a computer system for generating a plot that evinces common result regions of a test as a function of at least one controllable input parameter, each of the at least one input parameter having a predetermined range and a predetermined resolution. The computer system includes a layout tool for defining an overall plot region being a function of a maximum and a minimum of each the predetermined range. The system further includes a delineator for subdividing the overall plot region into at least two sub-regions, each of the sub-regions having a sub-region boundary, and an evaluator for evaluating a plurality of boundary test conditions on the sub-region boundary according to the test, so as to assign a test status to each of the plurality of boundary test conditions. The computer system also includes a designator (i) for designating the sub-region with the common test status for each of the sub-regions with at least a predetermined threshold number of boundary test conditions having a common test status, and (ii) for designating the sub-region with an indeterminate status for each of the sub-regions not having at least the predetermined threshold number of boundary test conditions with a common test status.

In another embodiment, the delineator, the evaluator and the designator recursively subdivide, evaluate and designate, respectively, each of the sub-regions designated with an indeterminate result status until all of the sub-regions are designated by a test status.

In another embodiment of the invention, the evaluator assigns either a pass test status or a fail test status to each of the plurality of boundary test conditions.

In another embodiment of the invention, the sub-region boundary includes a plurality of corner test conditions, and the plurality of boundary test conditions includes the corner test conditions.

In another embodiment of the invention, the predetermined threshold number of boundary points includes all of the corner test conditions.

BRIEF DESCRIPTION OF DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

Figure 1:
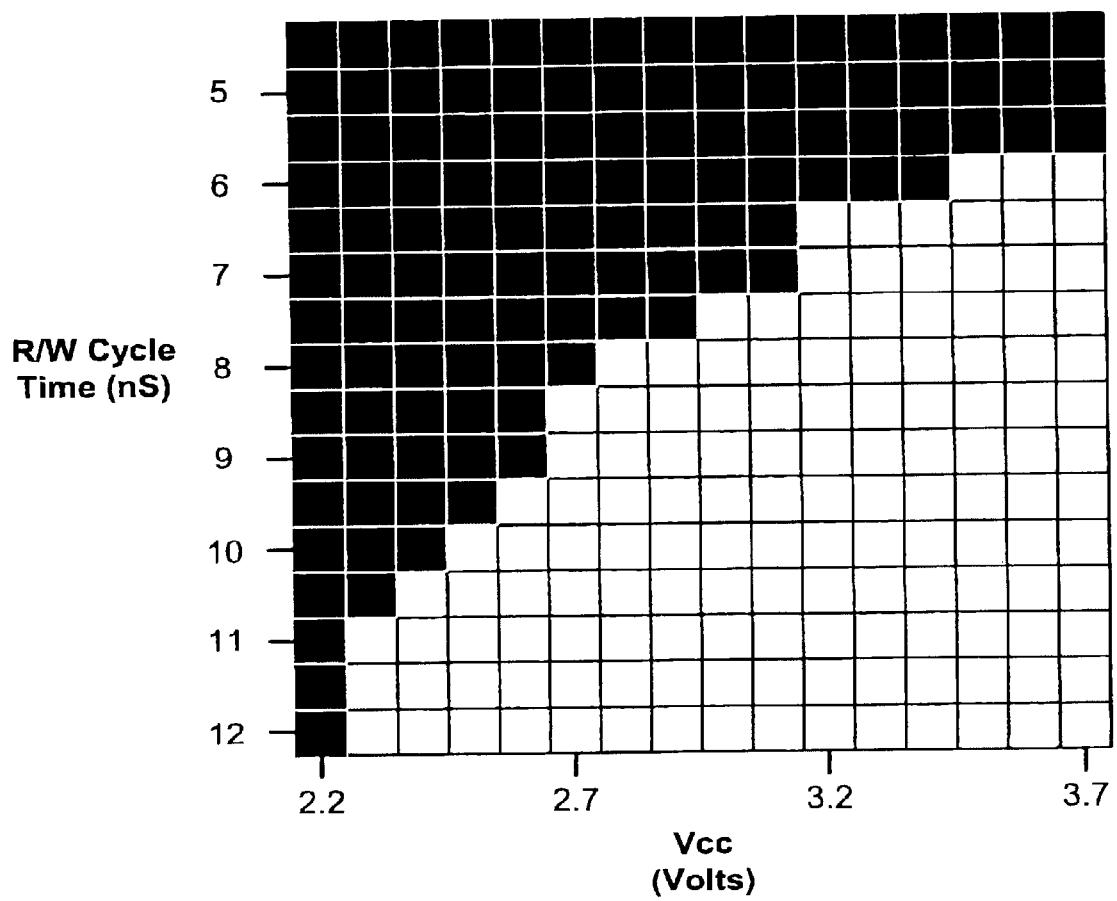
FIG. 1 illustrates an example of a two dimensional shmoo plot.
Figure 2:
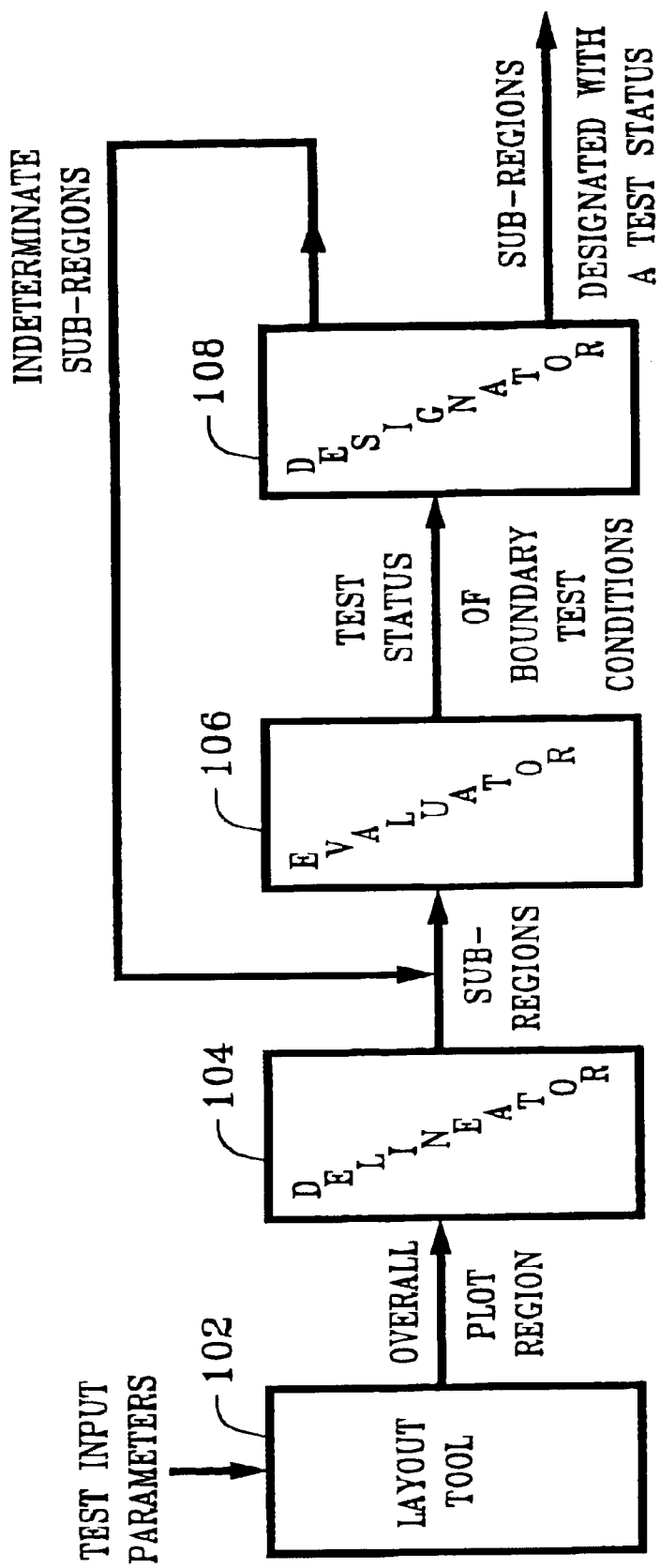
FIG. 2 shows a block diagram of one preferred embodiment of an system for generating a binary shmoo plot.
Figure 3:
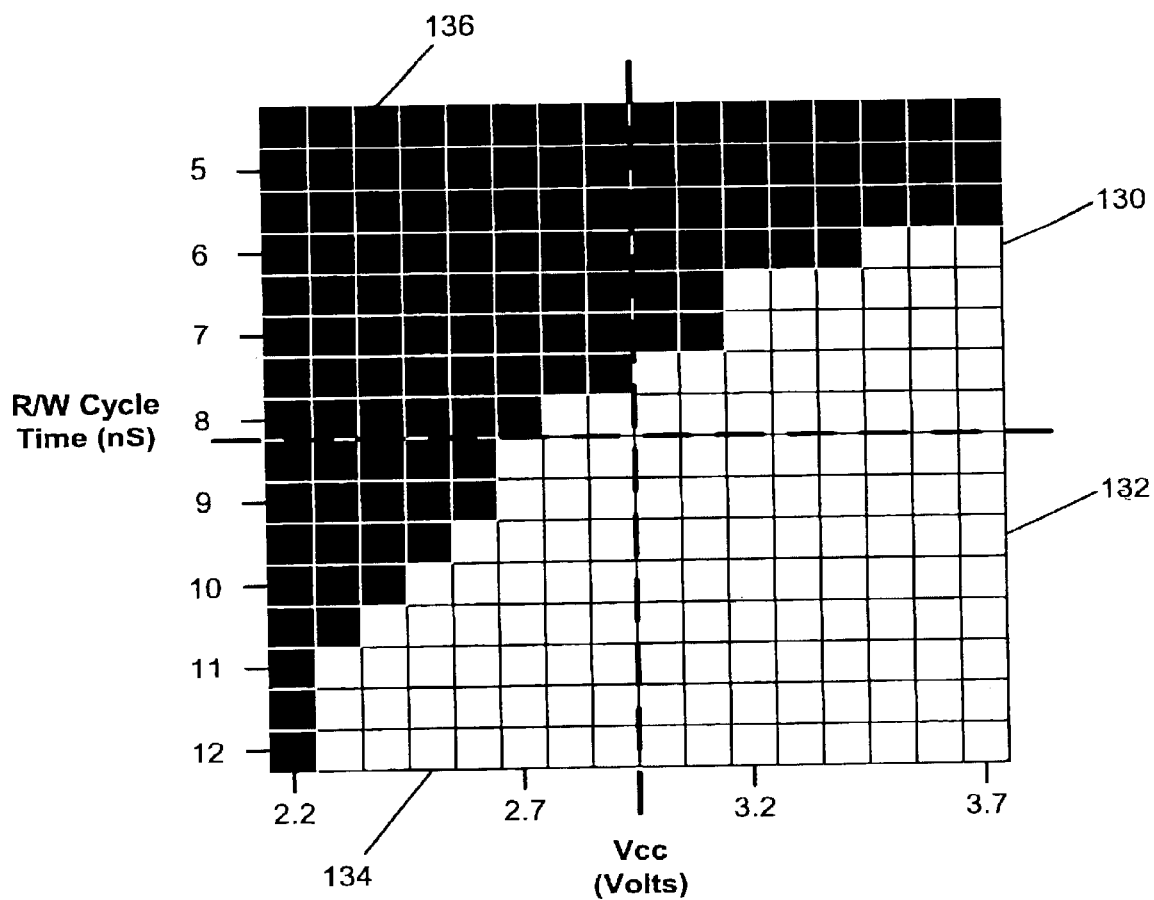
FIG. 3 graphically shows the results of the delineator subdividing the overall plot region of the shmoo plot of FIG. 1 into multiple sub-regions.
Figure 4:
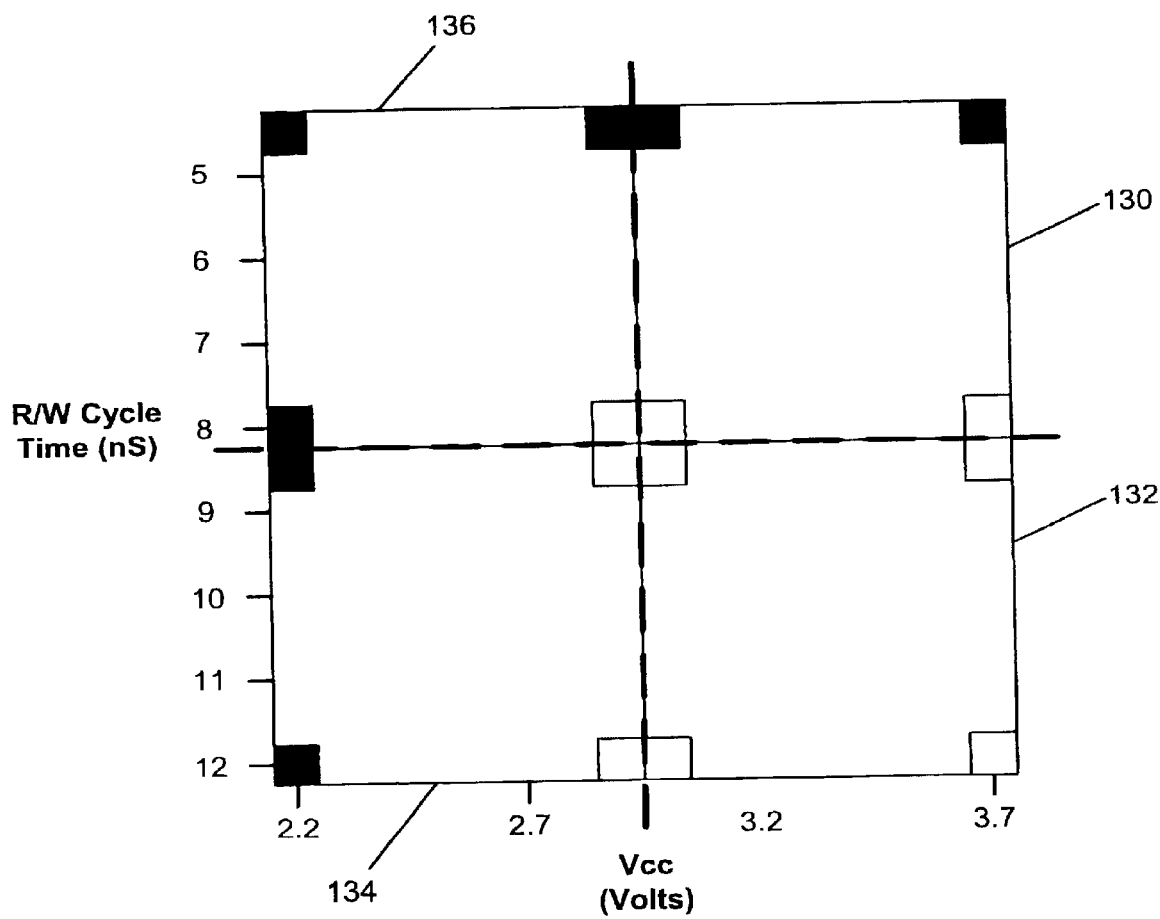
FIG. 4 graphically shows the results of the evaluator identifying and assigning test statuses to each of the corner test conditions of the sub-regions of FIG. 3.

FIG. 2 shows a block diagram of one preferred embodiment of an system for generating a binary shmoo plot in N-dimensional space as a function of N controllable parameters, including a layout tool 102, a delineator 104, an evaluator 106 and a designator 108. In this exemplary embodiment, the layout tool 102 receives the maximum value and minimum value for each of the N parameters, and uses these extreme to determine and generate a model representing the overall plot region. The overall plot region thus defines all possible test conditions with respect to the N controllable parameters. The delineator 104 receives the model representing the overall plot region from the layout tool 102 and subdivides the overall plot region into sub-regions. In a preferred embodiment, the delineator 104 divides the overall region into $2^N$ substantially equal sub-regions each having $2^N$ corners, although in other embodiments the overall region could be divided into several sub-regions having various, non-uniform shapes. In one preferred embodiment, the sub-regions are contiguous, although in other embodiments some or all of the sub-regions may be non-contiguous. For example, FIG. 3 shows the results of the delineator 104 subdividing the overall plot region of the shmoo plot of FIG. 1. In this example, the overall region is a two dimensional array (i.e., N=2) divided into four equal sub-regions (i.e., $2^2$), each having four corners (i.e., $2^2$). Each corner represents a unique test condition of the overall plot region. The first sub-region 130, the second sub-region 132, the third sub-region 134 and the fourth subregion 136 are all rectangular arrays of 8×8. The delineator 104 provides models representing these sub-regions to the evaluator 106, which evaluates the performance test for some or all of the parameter values at the boundary of each sub-region. In the exemplary case of FIG. 3, the evaluator evaluates the performance test for the parameter values corresponding to each of the corners of each of the sub-regions and assigns a test status (either pass or fail) to the corresponding corner. In this two dimensional example, each corner represents a test condition corresponding to a discrete value of each input parameter (in this case, a discrete $V_{CC}$ voltage and a discrete cycle time). For example, referring again to FIG. 3, the first sub-region 130 includes corners (3.0, 4.5), (3.7, 4.5), (3.7, 8.0) and (3.0, 8.0), which result in the corresponding test results fail, fail, pass and pass, respectively. After the evaluator 106 evaluates the performance test for the corners of each of the four sub-regions 130, 132, 134 and 136, the designator 108 receives a model corresponding to the sub-region results shown in FIG. 4. In general, the designator designates each sub-region as a function of some or all of the sub-region boundary assignments. In the exemplary case of FIG. 3, the designator 108 designates each sub-region as a function of the results of the corner performance tests as follows: if all corners in a particular sub-region are assigned the same test status, that entire sub-region is designated with the test status, and if any two corners are assigned different test status, that sub-region is designated as 'indeterminate'. Note that if an entire sub-region is designated with a test status, the test statuses for all of the test conditions within the sub-region (except for those on the boundary that were actually tested) are assume test statuses.

Referring again to FIG. 4, the designator designates the entire sub-region 132 as a "pass" region, because all four corners (3.0, 8.5), (3.7, 8.5), (3.7, 12.0) and (3.0, 12.0) have been assigned a "pass" test status by the evaluator 106. This embodiment of the invention performs no further processing of a sub-region once that entire sub-region has been designated with a test status. Since none of the sub-regions 130, 134 nor 136 have all four corners with identical test status, all three subregions 130, 134 and 136 are designated as indeterminate by the designator 108. As shown in FIG. 2, sub-regions designated as indeterminate return to the input of the delineator 104 for further processing.

Figure 5:
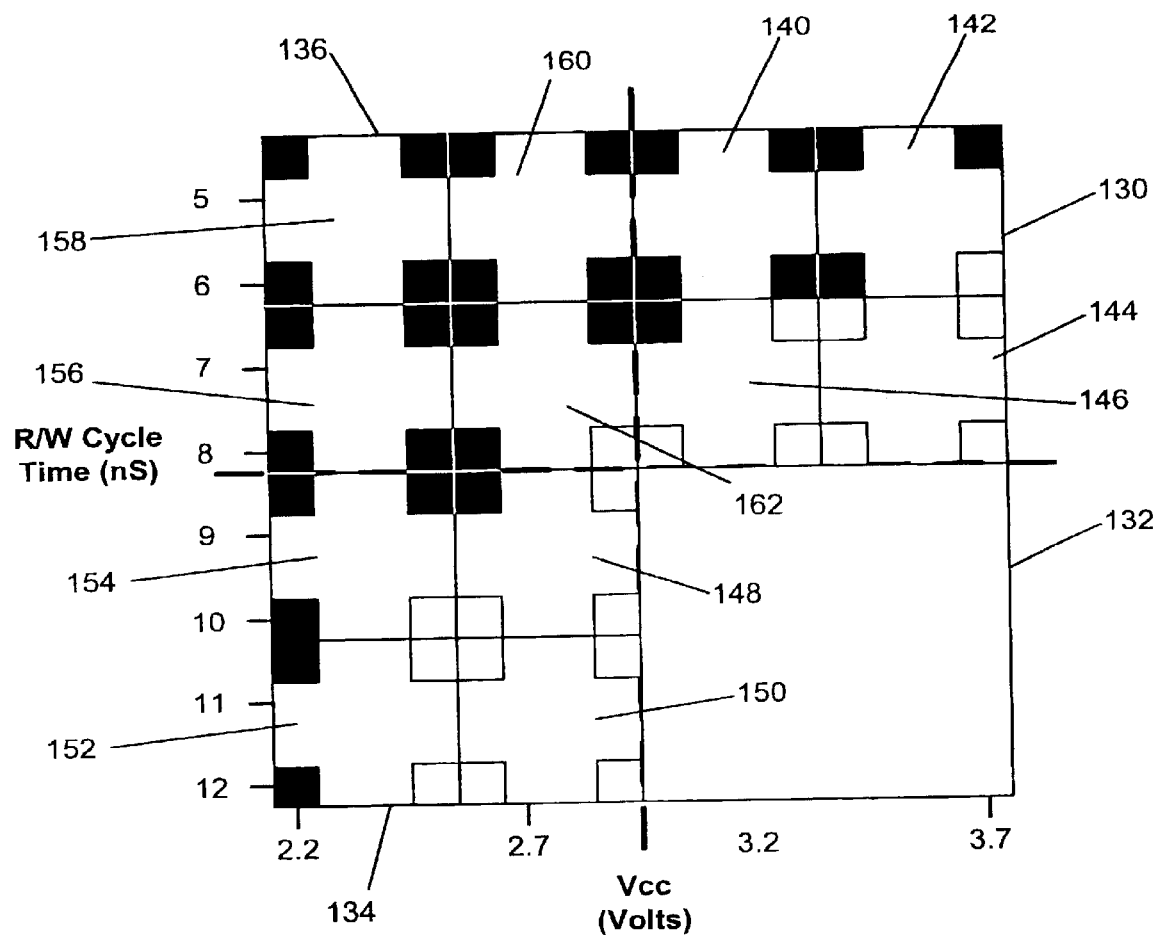
FIG. 5 graphically shows the results of the delineator further subdividing the indeterminate sub-region into smaller sub-regions.
Figure 6:
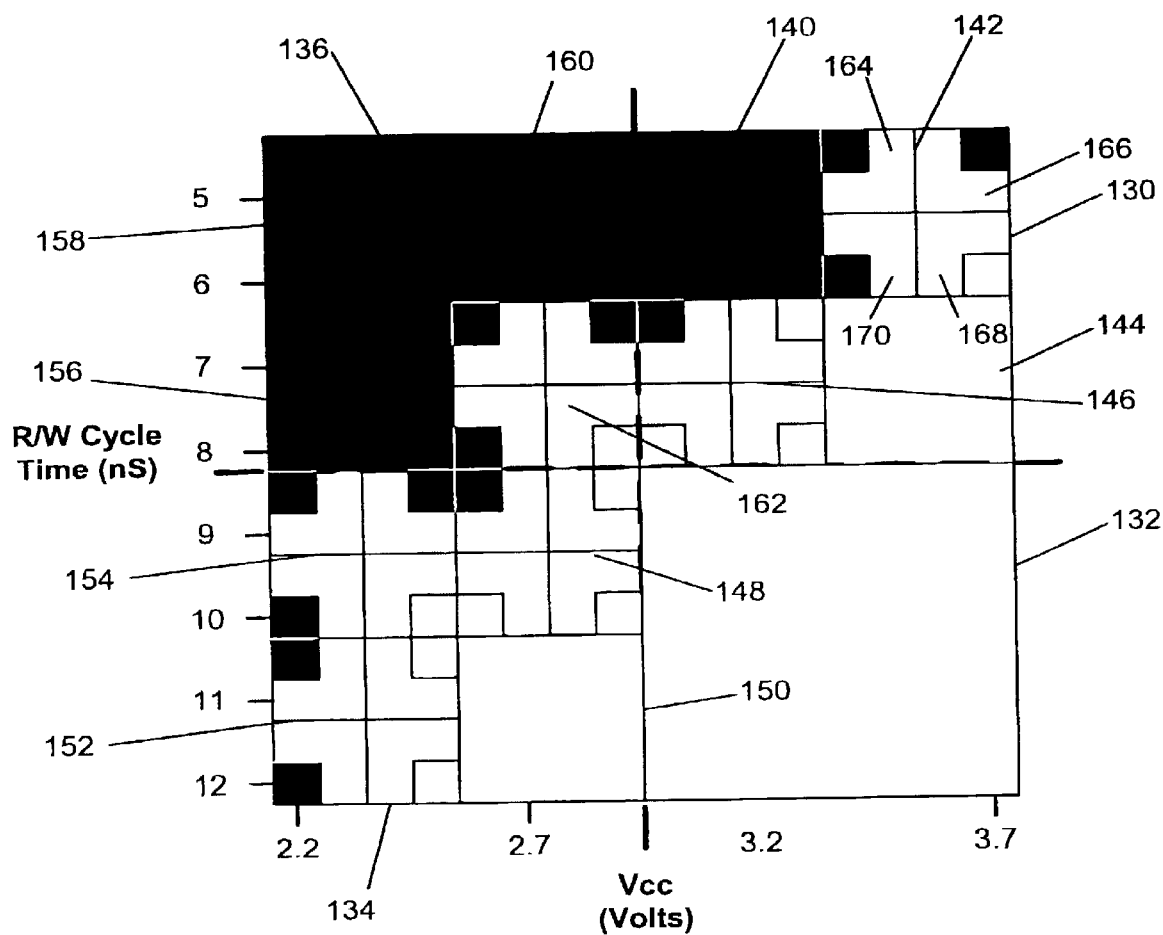
FIG. 6 graphically shows the results of the evaluator identifying and assigning test statuses to each of the corner test conditions of the smaller sub-regions of FIG. 5.

The delineator 104 receives the indeterminate sub-region from the designator 108 and further subdivides the indeterminate sub-region into $2^N$ smaller sub-regions, as shown in FIG. 5 (in this exemplary case, 4 smaller sub-regions). Sub-region 130 is divided into smaller subregions 140, 142, 144 and 146. Sub-region 134 is divided into smaller sub-regions 148, 150,152 and 154. Sub-region 136 is divided into smaller sub-regions 156, 158, 160 and 162. The evaluator 106 evaluates the performance test for the parameter values corresponding to each of the $2^N$ (in this exemplary case, four) corners of each of the smaller sub-regions and assigns a test status (either pass or fail) to the corresponding corner as shown in FIG. 5. The designator 108 again designates each smaller sub-region as a function of the results of the corner performance tests, as described hereinbefore. For example, in sub-region 130, the evaluator 106 assigns all four corners of the smaller sub-region 140 with a pass test status, so the designator 108 designates the entire smaller sub-region 140 with a fail test status, as shown in FIG. 6. Likewise, the designator 108 designates the smaller sub-region 144 with a pass test status, and designates the smaller sub-regions 142 and 146 with an indeterminate test status.

This recursive procedure continues until no sub-regions remain that are designated as indeterminate, or until all possible test conditions within the indeterminate sub-regions have been evaluated. The latter situation in shown in the exemplary case of FIG. 6. The delineator 104 further subdivides the sub-region 142 into four smaller sub-regions 164, 166, 168 and 170. When the evaluator 106 evaluates the four corners of the smaller sub-region 164, all possible test conditions within smaller sub-region will have been evaluated, since the smaller sub-region 164 only includes those four corners and further sub-dividing is not possible.

Although the exemplary embodiments shown in FIGS. 2–6 describe a system and method for generating a two-dimensional shmoo plot by recursively subdividing the overall plot into $2^N$ sub-regions having substantially identical shapes and sizes, alternate embodiments of this invention using the same general concepts described herein can generate an N-dimensional shmoo plot and can recursively subdivide the overall plot into dissimilar shapes. For example, a three dimensional shmoo plot provides a representation of performance test results as three functional parameters are varied over their respective ranges. The overall plot region for a three dimensional shmoo plot includes a rectangular parallelepiped having $2^3=8$ corners. The overall plot region is initially subdivided into $2^3=8$ equal sub-regions, each being a rectangular parallelepiped having 8 corners. The corners of each sub-region are evaluated according to the associated performance test and each corner is consequently assigned a pass or fail test status. If all eight corners of a sub-region are identical, that sub-region is designated with the test status of its corners. Otherwise, the sub-region is again subdivided and evaluated. This procedure is performed recursively as described herein for the two dimensional case until all sub-regions are designated with a test status or all test conditions have been evaluated.

Further, although the exemplary embodiments describe a system and method that evaluates $2^N$ corners of each of the equal size and shape sub-regions, alternate embodiments of the invention can designate the sub-regions by evaluating other portions of the sub-region. For example, for an irregular shaped sub-region (i.e., one without distinct corners), an embodiment of the evaluator 106 could evaluate all test conditions along the sub-region boundary, or the evaluator 106 could evaluate only predetermined ones of the test conditions along the sub-region boundary.

Figure 7:
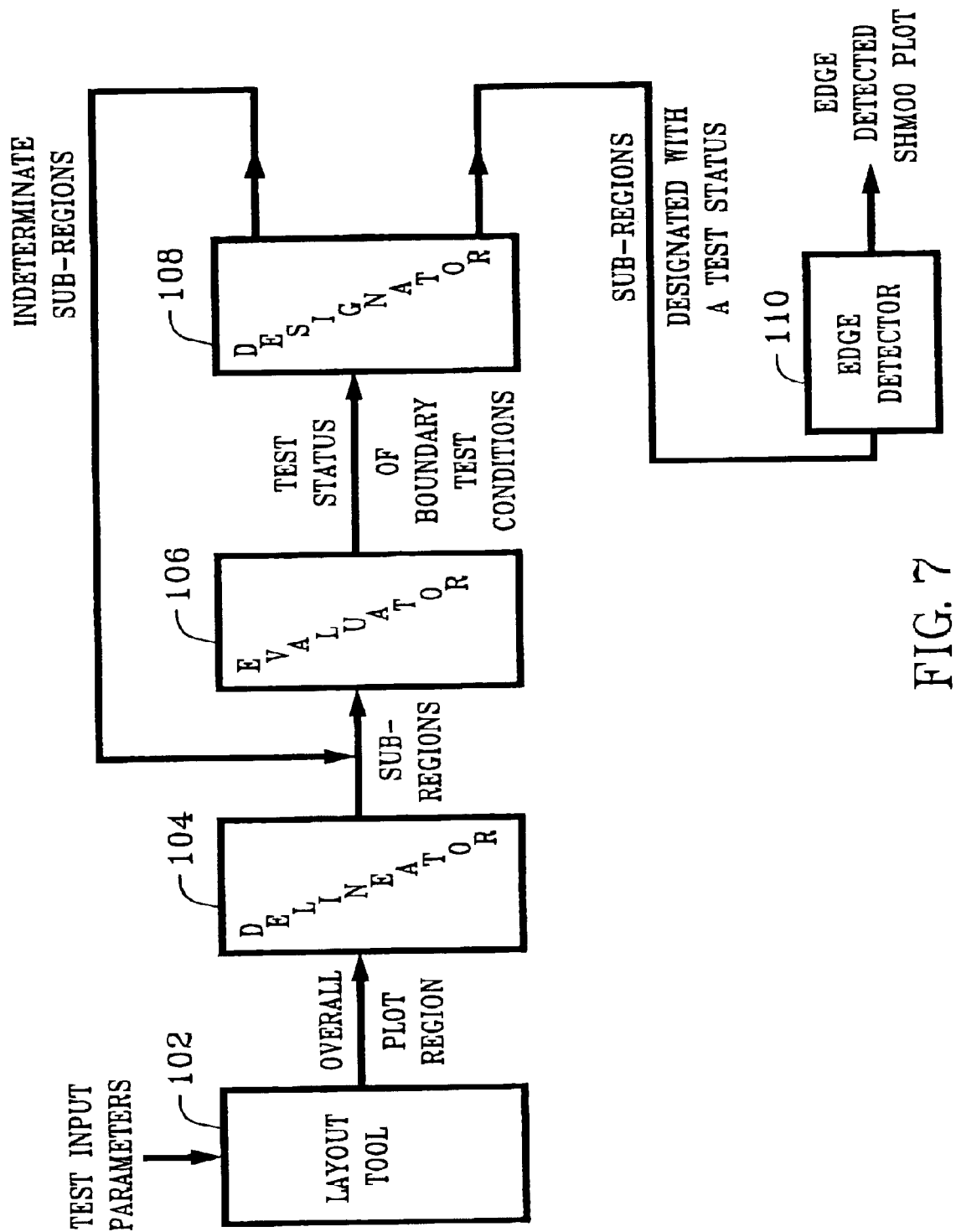
FIG. 7 shows a block diagram of another embodiment of the system shown in FIG. 2.
Figure 8:
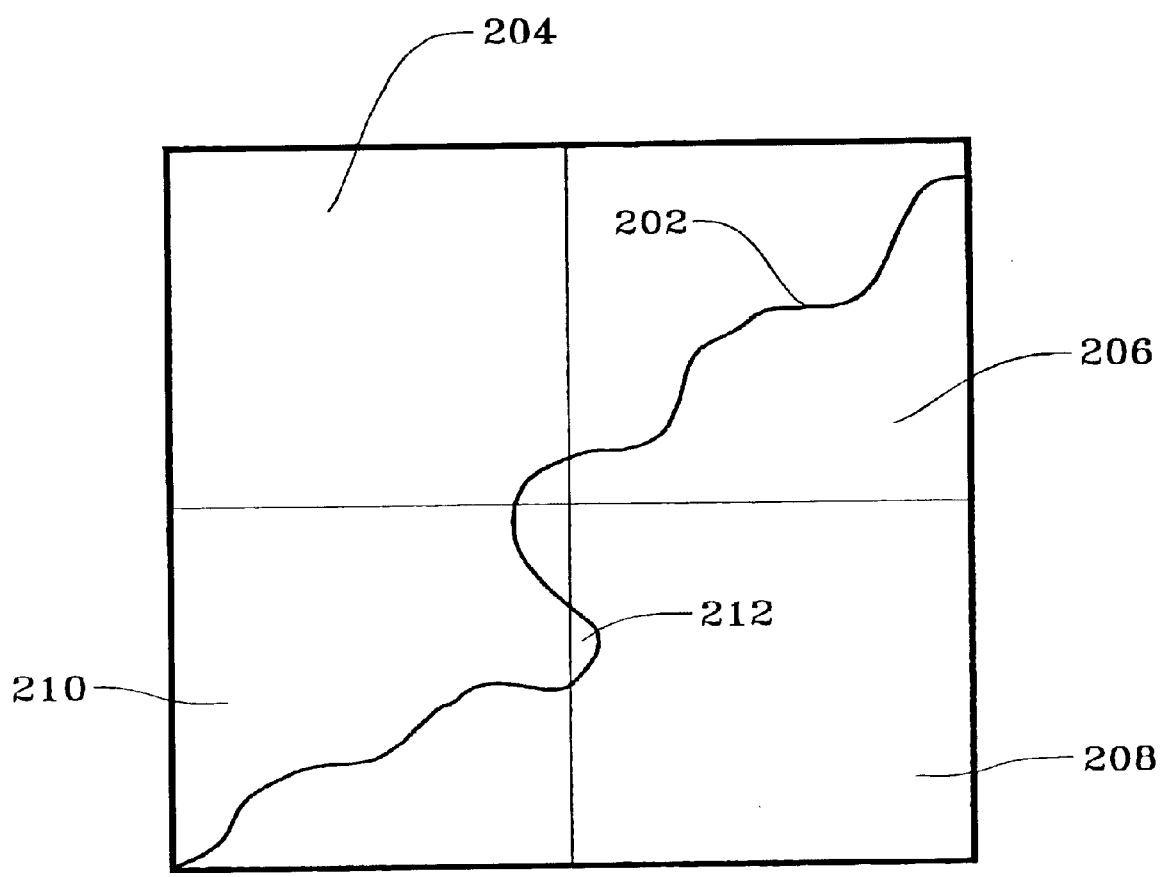
FIG. 8 illustrates a set of test conditions in which a designation error could occur.
Figure 9A:
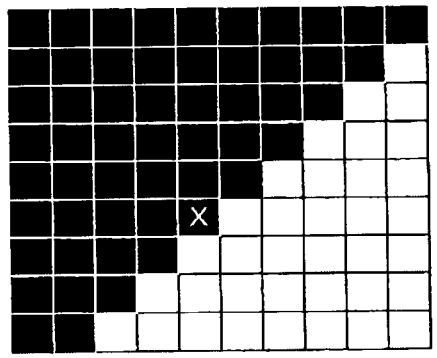
FIG. 9A graphically illustrates a straight-line boundary between a failing region and a passing region.
Figure 9B:
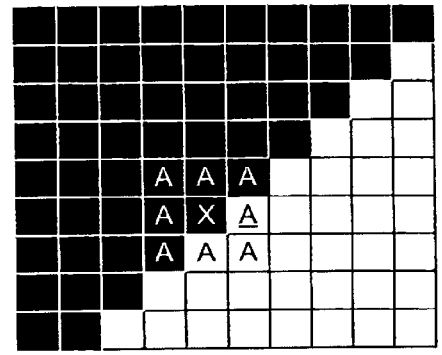
FIG. 9B graphically illustrates the results of the edge detector identifying a first set of adjacent test conditions.
Figure 9C:
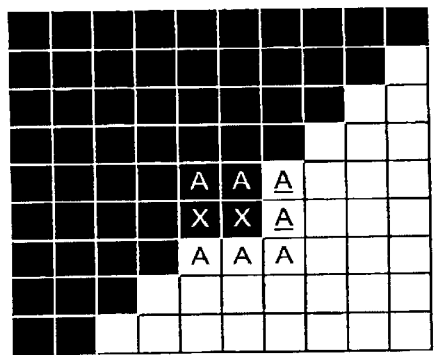
FIG. 9C graphically shows the identification of a second set of adjacent test conditions.
Figure 9D:
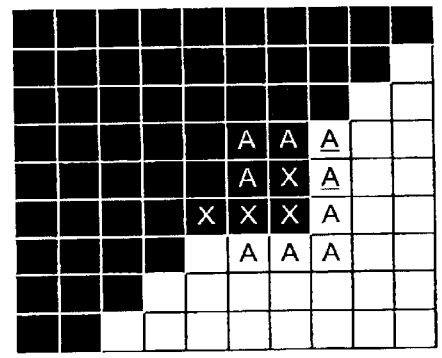
FIG. 9D graphically shows the identification of a third set of adjacent test conditions.
Figure 9E:
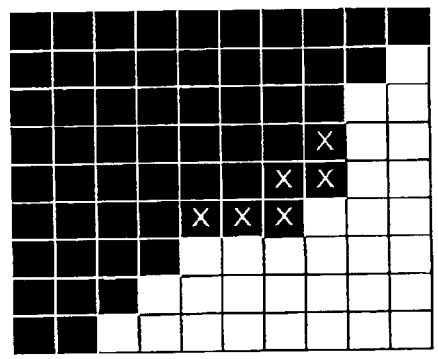
FIG. 9E graphically illustrates the partial results of the edge detector processing the straight-line boundary of FIG. 9A.

In another embodiment of the invention, illustrated in FIG. 7, the system further includes an edge detector 110 for identifying and correctly designating test conditions that may have been erroneously designated by the above-described embodiments. FIG. 8 illustrates a situation (i.e., a set of test conditions) for which such an error could occur. In FIG. 8, the transition line 202 describes the actual transition from passing to failing. The area to the left and above the line 202 represents failed performance tests, and the area to the right and below the line 202 represents passed performance tests. Because the line 202 briefly loops back into the sub-region 208 from sub-region 210 without including a corner of sub-region 208, the initial evaluation of sub-region 208 with the above-described embodiments would designate the entire sub-region 208 as a "pass" region, thus missing the small number of erroneously designated, failed test conditions 212 in sub-region 208. The edge detector 110 operates by first distinguishing between those test conditions that were actually evaluated and assigned a test status by the evaluator 106 during the above-described procedure, and those test conditions that were designated with a test status by the designator 108 due to the boundary conditions of the parent sub-region (i.e., assumed test statuses). The edge detector 110 evaluates all of the un-evaluated test conditions (having assumed test statuses) that are adjacent to, and were designated with a different test status from, the test conditions that were actually evaluated by the evaluator 106. If the result of an actual evaluation of a previously un-evaluated test condition indicates that the assumed test status was incorrect, the edge detector 110 reassigns that test condition with the test status from the actual evaluation. A test condition that has its test status changed by this procedure is treated in the same manner as one of the test conditions that were actually evaluated by the evaluator 106, i.e., all adjacent test conditions having an assumed test status that is different are actually evaluated. This procedure continues until no assumed value/adjacent test conditions remain. A simple example of the operation of the edge detector 110 is shown in FIGS. 9A–9E. FIG. 9A shows a shmoo plot showing a substantially straight line transition from failing (black) to passing (white). The failing test result on the test condition labeled with an "X" is a test result that the evaluator 106 assigns as a result of an actual performance test. All other (unlabeled) test results were designated by the designator 108, i.e., they are assumed test results. FIG. 9B shows the adjacent test conditions, each labeled with an "A," that are initially analyzed by the edge detector 110. The underlined "A" represents an adjacent test condition that when tested via the performance test, indicates a different actual test results (i.e., fail-black) as compared to the assumed test results (i.e., pass-white). Thus, as shown in FIG. 9C, the edge detector changes the test result of that test condition to its actual test result (i.e., fail-black). FIG. 9C also shows all of the test conditions adjacent to the newly-designated test condition. Again, the underlined "A" represents an adjacent test condition that when tested via the performance test, indicates a different actual test results (i.e., fail-black) as compared to the assumed test results (i.e., pass-white). The edge detector 110 again changes the state of those two test conditions, as shown in FIG. 9D. Both of those test conditions are labeled with an "X," and their adjacent test conditions with assumed test statuses (labeled with "A's") are subsequently identified and analyzed via the performance test by the edge detector 110. FIG. 9D shows that of the 9 adjacent test conditions with assumed test states, only two of them (designated with underlined "A's") have incorrect test statuses, and those are shown designated with their actual test statuses in FIG. 9E. In the next step (not shown), the edge detector 110 analyzes those adjacent test conditions having assumed test statuses of the two newly designated test conditions. This procedure continues until all such adjacent test conditions are evaluated by the edge detector 110. Comparing FIG. 9A with FIG. 9E shows how the edge detector 110 modifies the relatively straight line that delineates the failing region from the passing region to include a failing "bump" into the passing region. Thus, the edge detector 110 would detect and re-assign the test conditions about the erroneously designated test conditions 212 shown in FIG. 8. In general, the edge detector follows the line between the passing and failing regions of the shmoo plot, and modifies the line by selectively evaluating individual test conditions via the performance test.

Figure 10A:
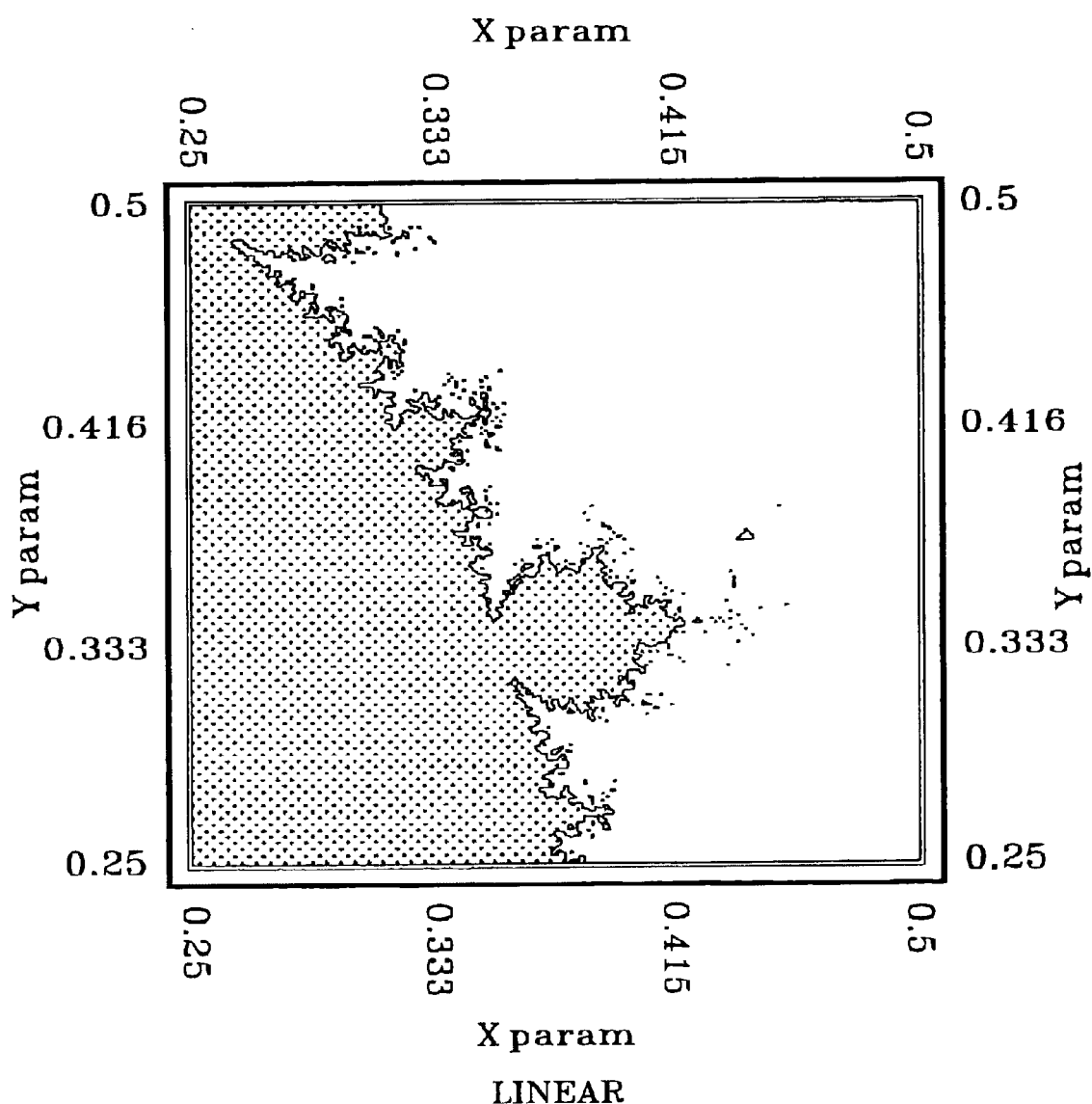
FIG. 10A shows a prior art two dimensional shmoo plot generated by evaluating all possible test conditions defined by the input parameters.
Figure 10B:
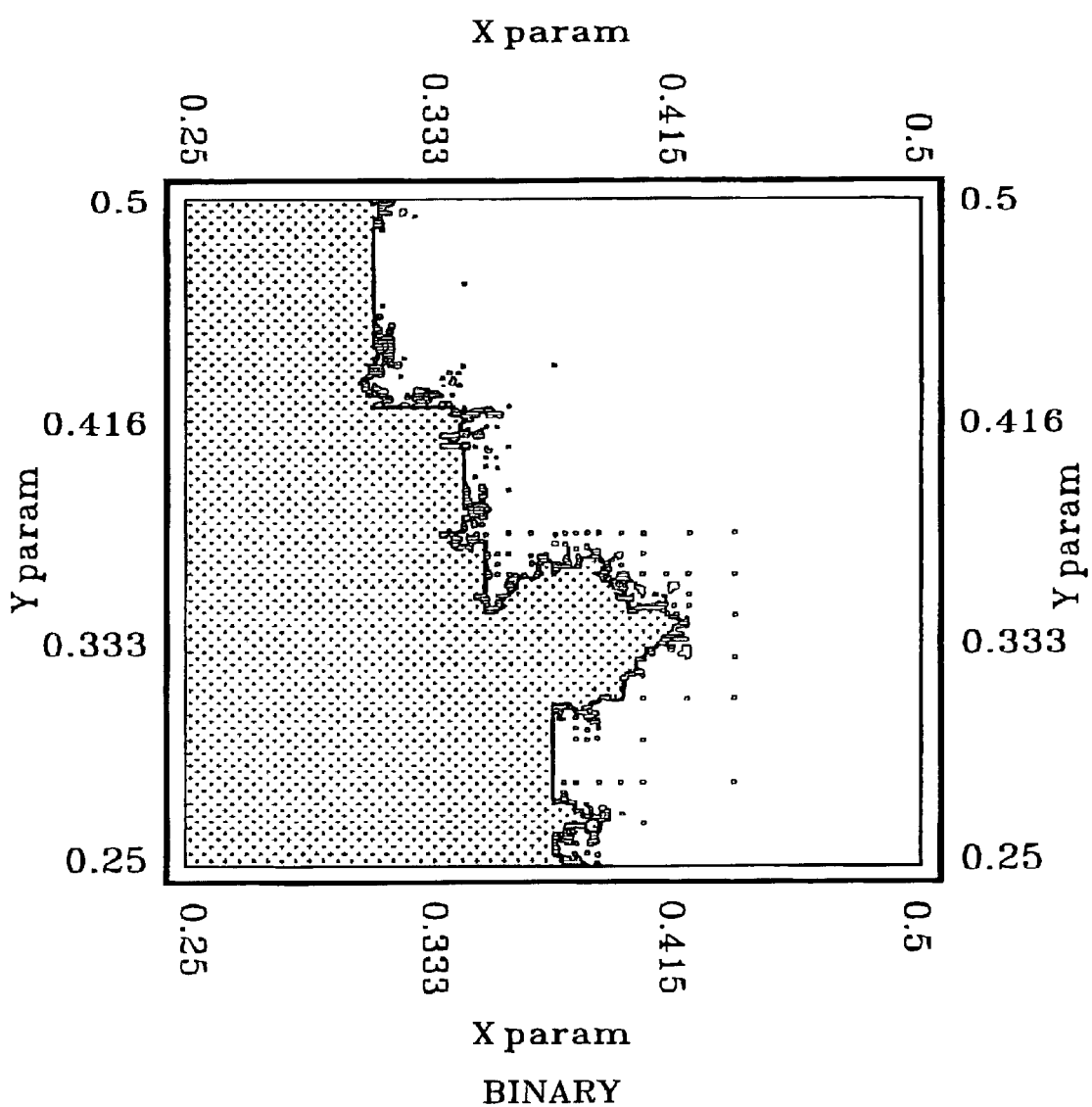
FIG. 10B shows a two dimensional shmoo plot generated by the system shown in FIG. 2, without an edge detector; and, FIG. 10C shows a two dimensional shmoo plot generated by the system shown in FIG. 2, with an edge detector.
Figure 10C:
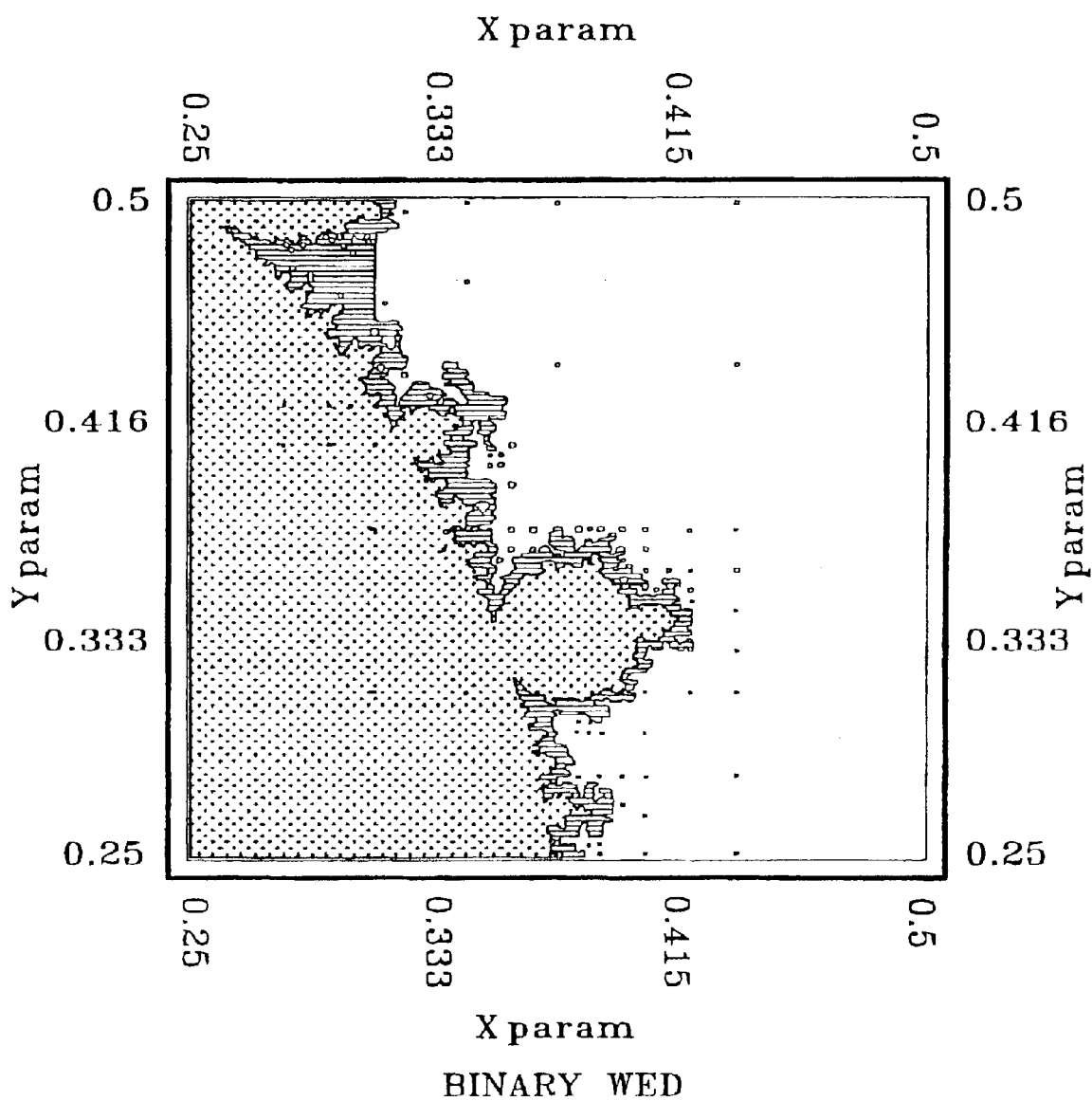

FIGS. 10A, 10B and 10C illustrate the performance differences among a prior art method, the method of the present invention without the edge detector, and the present invention with the edge detector, respectively. The two dimensional shmoo plot of FIG. 10A, generated by the prior art method of evaluating all possible test conditions defined by the input parameters, took approximately 478 seconds to complete. The two dimensional shmoo plot of FIG. 10B, generated by the system shown in FIG. 2, took approximately 36 seconds to complete. FIGS. 10A and 10B shows that the time to complete the plot using the system of FIG. 2 is reduced by more than an order of magnitude as compared to the prior art method. However, comparing FIGS. 10A and 10B also shows a significant reduction in the plot accuracy from the prior art baseline. Comparing FIGS. 10A and 10C shows that although adding the edge detector requires an additional 11 seconds to complete the shmoo plot (as compared to FIG. 10B), it is still more than an order of magnitude faster than the prior art method. FIG. 10C shows that the additional 11 seconds provides a significant amount of detail in the resulting shmoo plot; the plot in FIG. 10C is nearly indistinguishable from the prior art plot of FIG. 10A.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A method of generating a plot that evinces common result regions of a test as a function of at least one controllable input parameter, each of said at least one input parameter having a predetermined range and a predetermined resolution, comprising the steps of:

defining an overall plot region being a function of a maximum and a minimum of each said predetermined range, said overall shmoo plot region including a plurality of test conditions, each of said test conditions corresponding to a value of each of said at least one input parameter;

subdividing said overall plot region into at least two sub-regions, each of said sub-regions having a sub-region boundary, and evaluating, for each of said sub-regions, a plurality of boundary test conditions on said sub-region boundary according to said test, so as to assign a test status to each of said plurality of boundary test conditions; and, for each of said sub-regions with at least a predetermined threshold number of boundary test conditions having a common test status, designating said sub-region with said common test status, and for each of said sub-regions not having at least said predetermined threshold number of boundary test conditions with a common test status, designating said sub-region with an indeterminate status.

2. A method according to claim 1, further including the step of recursively performing said subdividing step, said evaluating step and said designating step for each of said sub-regions designated with an unknown result status until all of said sub-regions are designated by a test status.

3. A method according to claim 1, wherein said evaluating step further includes the step of assigning either a pass test status or a fail test status to each of said plurality of boundary test conditions.

4. A method according to claim 1, wherein said sub-region boundary includes a plurality of corner test conditions, and said plurality of boundary test conditions includes said corner test conditions.

5. A method according to claim 4, wherein said predetermined threshold number of boundary test conditions includes all of said corner test conditions.

6. A method according to claim 1, wherein said at least two sub-regions are substantially identical.

7. A method according to claim 1, wherein said plot is an N-dimensional plot corresponding to N controllable input parameters.

8. A method according to claim 1, further including the step of searching for at least one discrepancy between (i) a test status of a test condition designated by said designating step, and (ii) a test status of said test condition according to said test.

9. A method according to claim 8, further including the step of evaluating, via said performance test, those test conditions having a test status designated by said designating step and being adjacent to a test condition having a test status assigned according to said performance test.

10. A method according to claim 8, further including the step of re-assigning said test condition according to said performance test.

11. A method of generating a shmoo plot as a function of a performance test and a plurality of parameters, each of said parameters having a predetermined parameter range and a predetermined parameter resolution, comprising the steps of:

defining an overall shmoo plot region as a function of a maximum and a minimum of each said predetermined parameter range, said overall shmoo plot region including a plurality of test conditions, each of said test conditions corresponding to a value of each of said plurality of parameters;

subdividing said overall shmoo plot region into sub-regions, and evaluating each of a plurality of corners of each of said sub-regions according to said performance test, so as to assign a test status, including either a pass status or a fail status, to each of said corners depending upon a result of said performance test;

for each of said sub-regions having all of said corners assigned a common status, designating said sub-region with said common status, and for each of said sub-regions not having all of said corners assigned a status, repeating said subdividing, evaluating and designating steps until all of said sub-regions have been designated with said test status.

12. A method according to claim 11, further including the step of searching for at least one discrepancy between (i) a test status of a test condition designated by said designating step, and (ii) a test status of said test condition according to said performance test.

13. A method according to claim 12, further including the step of evaluating, via said performance test, those test conditions having a test status designated by said designating step and being adjacent to a test condition having a test status assigned according to said performance test.

14. A method according to claim 12, further including the step of re-assigning said test condition according to said performance test.

15. A method of generating an N dimensional shmoo plot as a function of a performance test and N parameters, each of said parameters having a predetermined parameter range and a predetermined parameter resolution, comprising the steps of:

defining an overall shmoo plot region as a function of a maximum and a minimum of each said predetermined parameter range, said overall shmoo plot region including a plurality of test conditions, each of said test conditions corresponding to a value of each of said N parameters;

subdividing said overall shmoo plot region into $2^N$ equal sub-regions, each said sub-region having $2^N$ corner test conditions, and evaluating each of said $2^N$ corner test conditions of each of said $2^N$ sub-regions according to said performance test, so as to assign a test status, including either a pass status or a fail status, to each of said $2^N$ corner test conditions depending upon a result of said performance test;

for each of said $2^N$ sub-regions having all of said $2^N$ corner test conditions assigned a common status, designating said sub-region with said common status, and for each of said $2^N$ sub-regions not having all of said $2^N$ corner test conditions assigned a status, repeating said subdividing, evaluating and designating steps until all of said sub-regions have been designated with said test status.

16. A method according to claim 15, further including the step of searching for at least one discrepancy between (i) a test status of a test condition designated by said designating step, and (ii) a test status of said test condition according to said performance test.

17. A method according to claim 16, further including the step of evaluating, via said performance test, those test conditions having a test status designated by said designating step and being adjacent to a test condition having a test status assigned according to said performance test.

18. A method according to claim 16, further including the step of re-assigning said test condition according to said performance test.

19. A computer system for generating a plot that evinces common result regions of a test as a function of at least one controllable input parameter, each of said at least one input parameter having a predetermined range and a predetermined resolution, comprising:

a layout tool for defining an overall plot region being a function of a maximum and a minimum of each said predetermined range;

a delineator for subdividing said overall plot region into at least two sub-regions, each of said sub-regions having a sub-region boundary, and an evaluator for evaluating a plurality of boundary test conditions on said sub-region boundary according to said test, so as to assign a test status to each of said plurality of boundary test conditions; and, a designator (i) for designating said sub-region with a common test status for each of said sub-regions with at least a predetermined threshold number of boundary test conditions having said common test status, and (ii) for designating said sub-region with an indeterminate status for each of said sub-regions not having at least said predetermined threshold number of boundary test conditions with said common test status.

20. A computer system according to claim 19, wherein said delineator, said evaluator and said designator recursively subdivide, evaluate and designate each of said sub-regions designated with an unknown result status until all of said sub-regions are designated by a test status.

21. A computer system according to claim 19, wherein said evaluator assigns either a pass test status or a fail test status to each of said plurality of boundary test conditions.

22. A computer system according to claim 19, wherein said sub-region boundary includes a plurality of corner test conditions, and said plurality of boundary test conditions includes said corner test conditions.

23. A computer system according to claim 22, wherein said predetermined threshold number of boundary test conditions includes all of said corner test conditions.

24. A computer system according to claim 19, further including an edge detector for detecting at least one discrepancy between (i) a test status of a test condition designated by said designating step, and (ii) a test status of said test condition according to said test.

25. A computer system according to claim 24, wherein said edge detector evaluates, via said performance test, those test conditions having a test status designated by said designating step and being adjacent to a test condition having a test status assigned according to said performance test.

26. A computer system according to claim 24, wherein said edge detector re-assigns said test condition according to said performance test.

* * * * *